(12) United States Patent
Edwards et al.

(10) Patent No.: US 9,153,569 B1
(45) Date of Patent: Oct. 6, 2015

(54) SEGMENTED NPN VERTICAL BIPOLAR TRANSISTOR (71) Applicant: Texas Instruments Incorporated, Dallas, TX (US)

(72) Inventors: Henry Litzmann Edwards, Garland, TX (US); Akram A. Salman, Plano, TX (US); Md. Iqbal Mahmud, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 14/222,288

(22) Filed: Mar. 21, 2014

(51) Int. Cl.
| H01L 29/66 | (2006.01) |
| H01L 27/02 | (2006.01) |
| H01L 29/737 | (2006.01) |
| H01L 27/082 | (2006.01) |

(52) U.S. Cl.
CPC ........ *H01L 27/0259* (2013.01); *H01L 27/0825* (2013.01); *H01L 29/7371* (2013.01)

(58) Field of Classification Search
CPC .............. H01L 21/8222; H01L 29/866; H01L 29/7371; H01L 29/66318
USPC ........................................................ 438/328
See application file for complete search history.

(56) References Cited

U.S. PATENT DOCUMENTS

| 6,465,870 | B2 | 10/2002 | Voldman | |
| 2002/0155670 | A1* | 10/2002 | Malik | 438/312 |
| 2004/0169234 | A1 | 9/2004 | Yu | |
| 2010/0001319 | A1* | 1/2010 | Pelouard et al. | 257/197 |
| 2010/0230719 | A1 | 9/2010 | Sawahata | |
| 2013/0277804 | A1* | 10/2013 | Cheng et al. | 257/586 |
| 2013/0320396 | A1 | 12/2013 | Salman et al. | |

* cited by examiner

*Primary Examiner* — Jami M Valentine
(74) *Attorney, Agent, or Firm* — Jacqueline J. Garner; Frank D. Cimino (57) ABSTRACT

A segmented bipolar transistor includes a p-base in a semiconductor surface including at least one p-base finger having a base metal/silicide stack including a base metal line that contacts a silicide layer on the semiconductor surface of the p-base finger. An n+ buried layer is under the p-base. A collector includes an n+ sinker extending from the semiconductor surface to the n+ buried layer including a collector finger having a collector metal/silicide stack including a collector metal line that contacts a silicide layer on the semiconductor surface of the collector finger. An n+ emitter has at least one emitter finger including an emitter metal/silicide stack that contacts the silicide layer on the semiconductor surface of the emitter finger. The emitter metal/silicide stack and/or collector metal/silicide stack include segmentation with a gap which cuts a metal line and/or the silicide layer of the stack.

18 Claims, 5 Drawing Sheets

SEGMENTED NPN VERTICAL BIPOLAR TRANSISTOR

FIELD

Disclosed embodiments relate to semiconductor device structures, and more particularly, to vertical bipolar transistors having structures for raising the electrostatic discharge tolerance of the transistor.

BACKGROUND

Bipolar junction transistors are active semiconductor devices formed by a pair of P-N junctions, including an emitter-base junction and a collector-base junction. An NPN bipolar junction transistor has a thin region of p-type material providing the base region between two regions of n-type material providing the emitter and collector regions. A PNP bipolar junction transistor has a thin region of n-type material providing the base region between two regions of p-type material constituting the emitter and collector regions. The movement of electrical charge carriers which produces electrical current flow between the collector region and the emitter region is controlled by an applied voltage across the emitter-base junction.

Conventional vertical NPN bipolar devices used for electrostatic discharge (ESD) protection of other devices typically include an n+ buried layer (NBL) together with a n+ sinker diffusion as collectors in each device stripe (or finger) to provide a low resistance-path to carry ESD strike induced current back to the top surface of the substrate (e.g., a top silicon surface). In BiCMOS technologies, it is a common practice to use vertical NPN transistors with an NBL as the collector and a deep n+ sinker diffusion to form the current return path for the ESD protection circuitry.

SUMMARY

Disclosed embodiments recognize electrostatic discharge (ESD) protection circuitry comprising vertical NPN transistor devices with a n+ buried layer (NBL) as the collector and a deep n+ sinker diffusion used to form the current return path show good current handling performance during ESD events for brief (e.g., 100 ns) Transmission Line Pulse (TLP) pulses. However, at longer TLP pulse lengths (e.g., 500 ns) the ESD-induced current flow results in filaments forming in the transistor(s) of the vertical NPN device, and as a result the device can experience thermal failure at relatively low currents. Furthermore, even for brief TLP pulses where a larger amount of current may be conducted without filamentation occurring, the NPN transistor's voltage goes up and down as a function of current level rendering the device a poor voltage clamp, nor are such devices scalable (e.g., 500 ns) to longer ESD pulses that are generally needed for system-level ESD protection, such as for automotive applications.

Disclosed embodiments describe "segmented" vertical NPN bipolar transistors that help prevent filamentation of the current flow during ESD events by preventing some of the lateral conduction paths by introducing added resistance into the sideways current flow path. Segmentation as used herein refers to "breaking" or "cutting" the metal on silicide stack (metal/silicide stack) of a given transistor terminal finger (or stripe), such as the emitter or collector, into multiple segments, whether the overall device can comprise a single NPN transistor having single or multiple terminal fingers or an array of NPN fingers each having single or multiple terminal fingers.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1A:
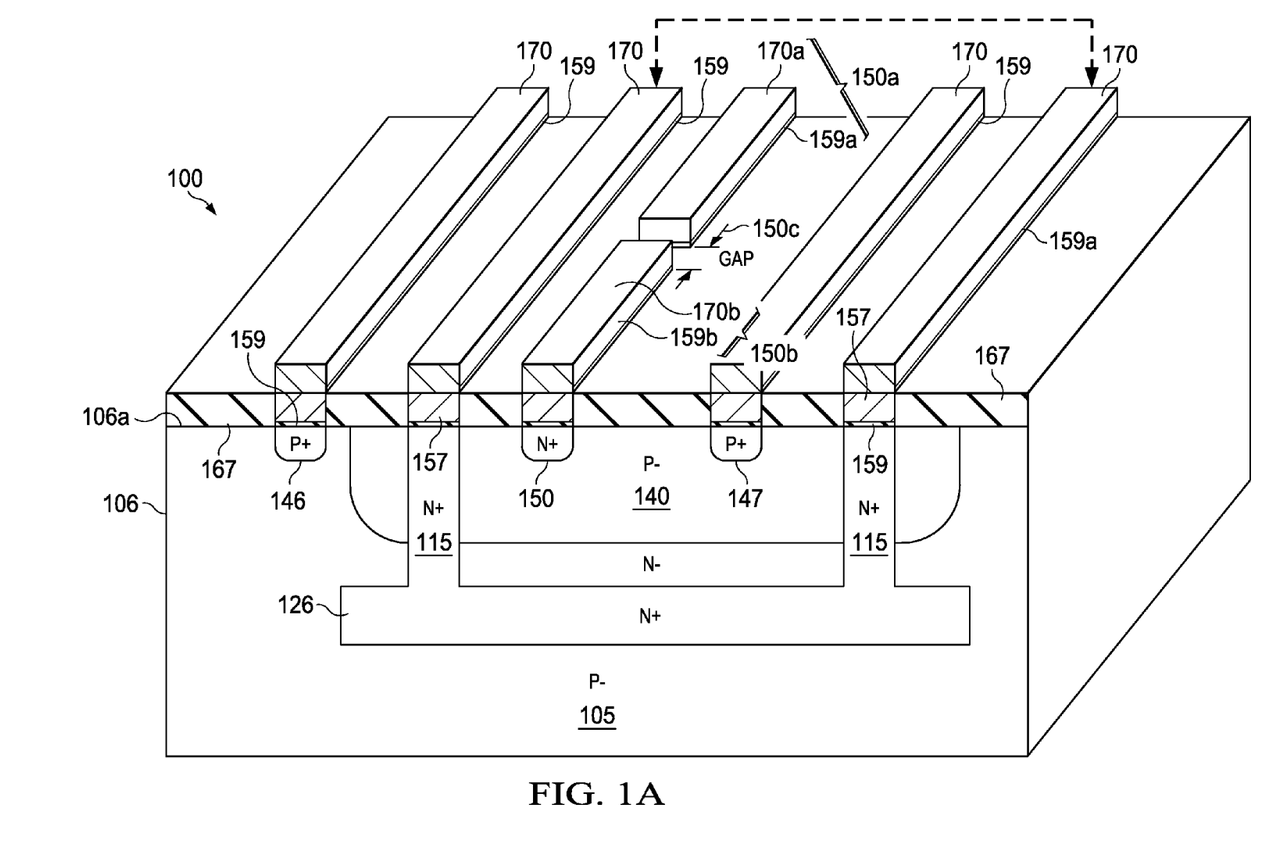
FIG. 1A is a perspective cross sectional view at a contact of an example single finger segmented NPN bipolar transistor having a cut with a resulting gap in both the metal line and silicide layer of the metal/silicide stack on the emitter finger, according to an example embodiment.

FIG. 1A is a perspective cross sectional view at a contact of an example single finger segmented NPN bipolar transistor (transistor 100) having a cut in the n+ emitter 150 (hereafter emitter 150) with a resulting gap 150c in both the metal line and silicide layer of the metal/silicide stack on the emitter 150, according to an example embodiment. The gap 150c is shown segmenting (separating) a first emitter metal/silicide stack segment 150a including metal line segment 170a on silicide layer segment 159a from a second emitter metal/silicide stack segment 150b including metal line segment 170b on silicide layer segment 159b which is shown contacting the emitter 150. Metal lines are generally referred to herein as metal line or metal lines 170, unless qualified with a letter suffix.

Although only a single contact through dielectric layer 167 filled with a plug metal (e.g., W) 157 is shown for each metal/silicide stack in the FIGs. such as shown in FIG. 1A to respective doped regions on semiconductor surfaces 106 on a substrate 105, each metal/silicide stack generally has a plurality of such contacts. Moreover, although a single gap 150c is shown in FIG. 1A, there can be multiple gaps, and disclosed gaps can be in one or more of the metal/silicide stacks of the emitter finger, base finger, and collector finger.

Disclosed segmentation of a metal/silicide stack directly on doped silicon or other semiconductor (all being electrically in parallel), involves removing at least one of a metal line 170 and silicide layer 159 under the metal cut to raise the resistance in the gap region created by the cut. Cutting the metal line 170 and leaving the silicide layer 159 under the metal cut in the metal/silicide stack is a "weak" form of disclosed segmentation because the silicide layer still provides a fairly low resistance path, while cutting both the metal line and the underlying silicide layer 159 (e.g., using a silicide block (SiBLK)) is a relatively "strong" form of segmentation because when the silicide layer 159 is cut in addition to the metal line 170 there over, the ESD-induced current is forced to flow in the doped silicon or other semiconductor below the silicide layer 159 which is generally of a far higher electrical resistance.

Transistor 100 is an example of a single finger transistor, that being the most basic transistor arrangement, as opposed to multi-finger transistors (see FIG. 1B described below), and multi-transistor arrays providing series connected transistors where each transistor can have multiple fingers (See FIG. 2B described below). Transistor 100 comprises substrate 105 shown as a p-substrate having a semiconductor surface 106 which can comprise silicon, silicon-germanium, or other semiconductor material. One particular arrangement is a semiconductor surface 106 comprising silicon/germanium (SiGe) on a substrate 105 comprising silicon. Reference 106a represents the top of the p-semiconductor surface 106 (top semiconductor surface 106a).

Transistor 100 includes an n+ sinker diffusion 115 that couples to the n+ BL (NBL) 126 which provides a low resistance path for passing ESD-induced current when transistor 100 is used as an ESD protection device (see FIG. 3 described below). N+ sinker diffusion 115 and NBL 126 generally comprises phosphorous, but may also comprise other n-dopants such as As or Sb.

Transistor 100 includes a p-base finger 140 and an n+ emitter 150 formed in the p-base finger 140. Although a single emitter finger is shown, disclosed bipolar transistors can have a plurality of emitter fingers. P-base finger 140 has a p+ base contact 147. The emitter 150 can comprise phosphorous, arsenic or antimony. NBL 126 is under the p-base finger 140. As noted above the second emitter metal/silicide stack segment 150b is shown contacting the emitter 150, while the first emitter metal/silicide stack segment 150a including metal line segment 170a on silicide layer segment 159a is shown separated from the first emitter metal/silicide stack segment 150a by gap 150c.

Dielectric layer 167 is shown including lateral to the respective contacts on the top semiconductor surface 106a. Contacts through the dielectric layer 167 include contacts to the p+ region 146 for contacting the p-semiconductor surface 106 and substrate 105, to the p+ base contact 147 for contacting the p-base finger 140, to the emitter 150, and to the N+ sinker diffusion 115.

The selective absence of the silicide layer 159 over the area of the gap 150c can be provided using a SiBLK process which involves leaving a layer (typically a dielectric layer) to prevent a deposited silicide layer from contacting the semiconductor surface. Gaps in a metal line 170 can be provided by a suitable metal mask, generally along with changes to the contact and SiBLK masks, without the need for any additional photomasked steps. Absence of the metal line 170 and underlying silicide layer 159 over the gap 150c forces ESD-induced current received from the circuit being protected into the surface of the emitter 150 for the length of the gap 150c which can add significant series resistance as compared to the first emitter metal/silicide stack segment 150a and second emitter metal/silicide stack segment 150b.

In some designs there are multi-finger single transistors which can also be described as having a plurality of transistor fingers or being multi-fingered. The designation "multi-finger" as used herein refers to the configuration of the base, emitter and optionally the collector diffusions of the device. A multi-fingered device generally comprises a plurality of emitter diffusion fingers (or stripes) interdigitated with a plurality of base diffusions fingers (or stripes). Multifingered arrangements improve the current carrying capability of the device. In other ESD protection circuit designs, there are stacks of transistors wired in series to increase the operation voltage. All of these transistor permutations can benefit from disclosed segmentation.

Figure 1B:
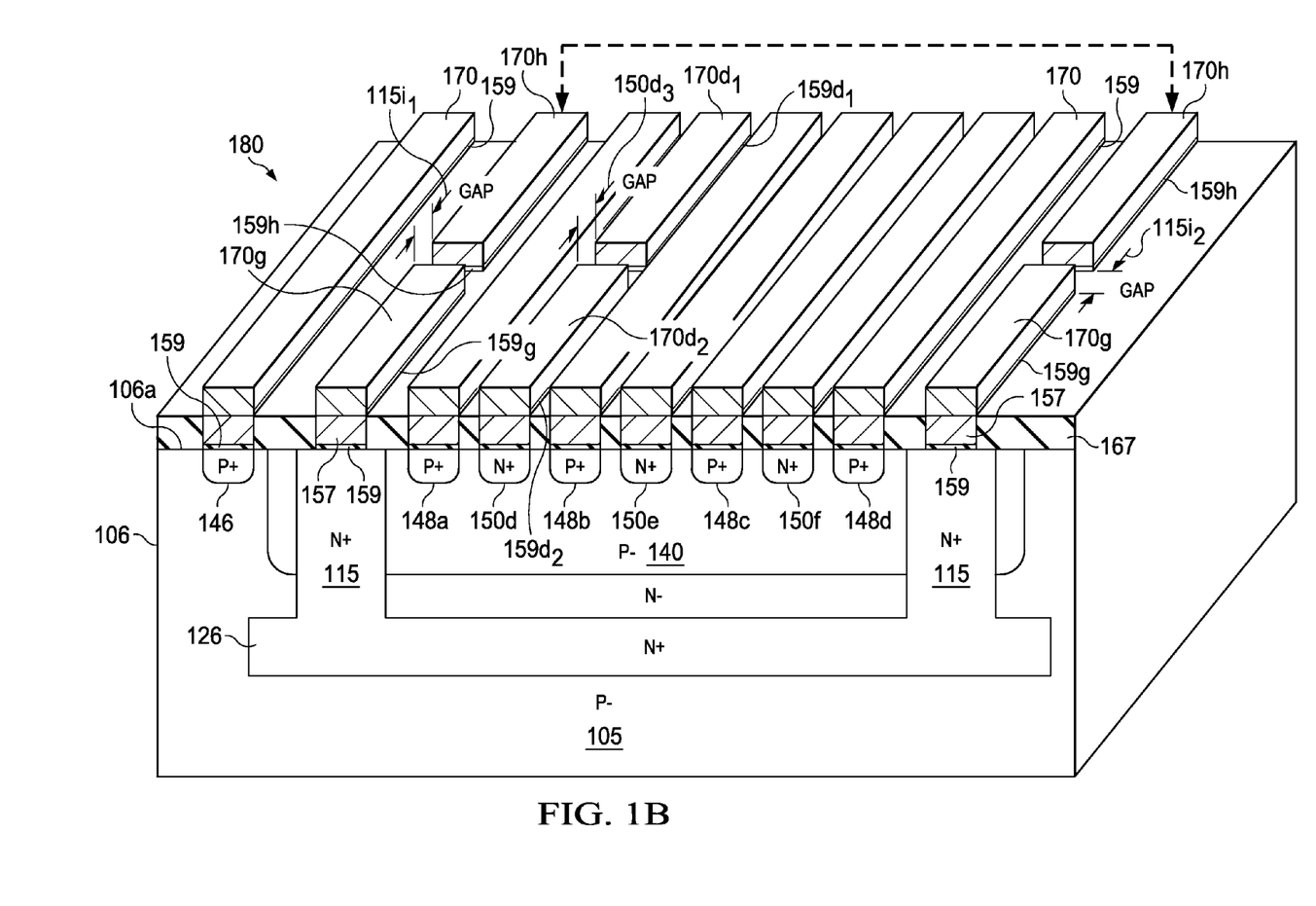
FIG. 1B is a perspective cross sectional view at a contact of an example multi-finger segmented vertical NPN bipolar transistor having a cut with resulting gaps through the metal line and silicide layer of the metal/silicide stack on one of the emitter fingers and a pair cuts to form gaps through the metal line and silicide layer on the collector strap, according to an example embodiment.

FIG. 1B is a perspective cross sectional view at a contact of an example multi-finger segmented vertical NPN bipolar transistor 180 (transistor 180) having a cut with resulting gaps through the metal line 170 and silicide layer 159 of the metal/silicide stack on emitter finger 150d being one of the three (3) emitter fingers 150d, 150e and 150f, and a pair of cuts to form gaps $115i_1$ and $115i_2$ through the metal line and silicide layer on the collector strap, according to an example embodiment. The multi-finger structure shown in FIG. 1B is employed to increase current handling capability of the transistor 180.

The first emitter metal/silicide stack segment comprises metal line segment $170d_1$ and silicide segment $159d_1$ while the second emitter metal/silicide stack segment comprises metal line segment $170d_2$ and silicide segment $159d_2$ separated by gap $150d_3$ which is through the metal line and the silicide. Base fingers in the semiconductor surface 106 are shown as 148a, 148b, 148c and 148d. The collector strap over the surface of the n+ sinker diffusion 115 is shown cut by gaps $115i_1$ and $115i_2$ into a first collector strap metal/silicide stack segment including metal line segment 170h on silicide segment 159h and a second collector strap metal/silicide stack segment including metal line segment 170g on silicide segment 159g.

To realize the multi-finger structure shown in FIG. 1B, an emitter (E) or base (B) can be arranged at the center of the device, and a symmetrical arrangement of bases or emitters is provided at both sides of the central emitter or base, in a formation represented as C/BE/BE . . . BE/B/C, wherein C is the collector having a n+ sinker diffusion 115 surface, and each B is used by neighboring E's. C's are formed at both ends of the structure and around the periphery of the structure in 2-dimensions, where the two collectors are connected to each other by a n+ sinker diffusion 115 to a NBL 126 formed below the multi-finger structure and a collector strap over the top semiconductor surface 106a.

Although shown for simplicity in both FIG. 1A and FIG. 1B as a single NPN bipolar device, for typical practical ESD protection applications an array of disclosed bipolar transistors may be used which provides series connected transistors to provide higher breakdown voltage capability, as opposed to a single large area bipolar transistor.

Figure 2A:
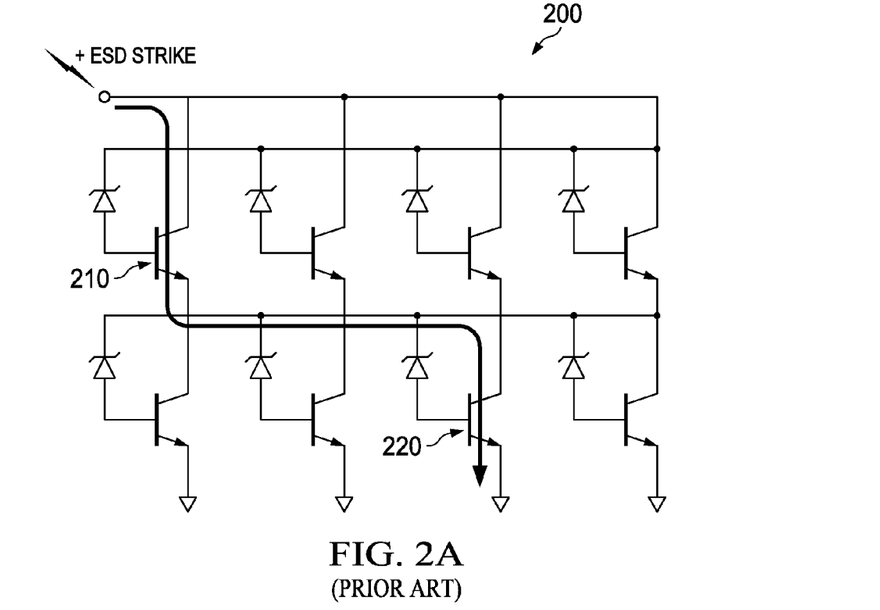
FIG. 2A is schematic of a conventional bipolar transistor array depicting current filamentation following an ESD strike.

FIG. 2A is schematic of a conventional bipolar transistor array 200 depicting current filamentation following an ESD strike depicted as a lightning bolt. The current is shown to all flow through a single transistor 210 in the first row of transistors, and a single transistor 220 in the second row of transistors to ground, resulting in significant heating of transistors 210 and 220 in the path of the current flow.

Figure 2B:
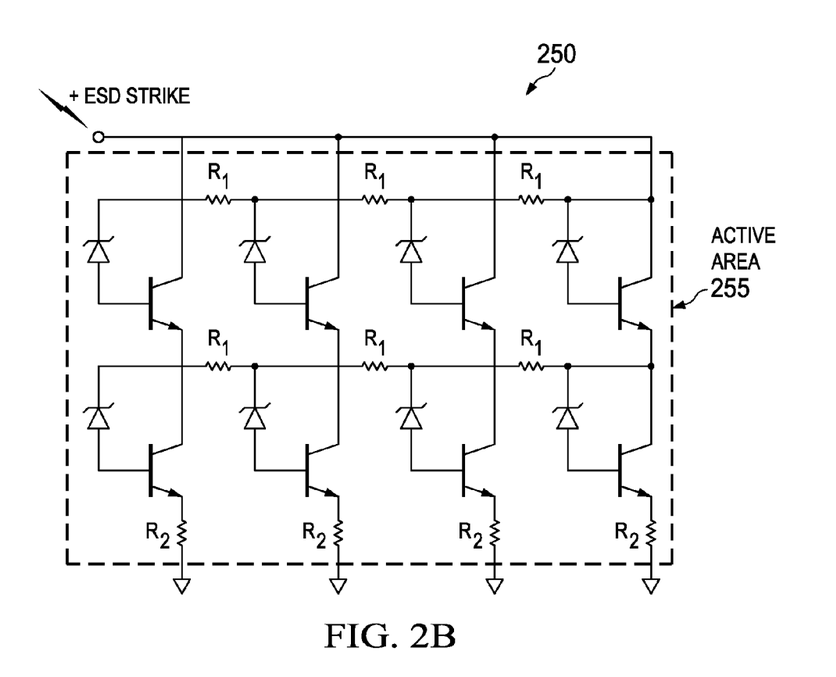
FIG. 2B is schematic of the transistors array in FIG. 2A with added resistance from blocking the silicide layer and metal cuts to provided added resistance (shown as $R_1$) in the paths of lateral current flow through the array during an ESD strike, with optional emitter degeneration resistors (shown as $R_2$), according to an example embodiment.

FIG. 2B is schematic of the transistors array in FIG. 2A modified to provide a disclosed segmented transistor array 250 having added resistance from blocking silicide and metal cuts over the blocked silicide to provided added resistance shown as $R_1$ in the path of lateral current flow through the array during an ESD strike, with optional emitter degeneration resistors shown as $R_2$, according to an example embodiment. The emitter degeneration resistors $R_2$ are shown in contact with a region of active area 255 (as opposed to over a dielectric layer, such as trench isolation or a field dielectric) which the transistors shown are also formed in. The emitter degeneration resistors $R_2$ in one embodiment comprises n+ doped polysilicon resistors. The current resulting from the ESD strike is shown to be substantially equally distributed through each of the four paths through the series connected pairs of disclosed segmented transistors between the node receiving the ESD strike (collectors of the transistors in the top row of transistors) and ground.

In some ESD-tolerance experiments performed where the emitter degeneration resistors comprised polysilicon, the polysilicon resistors formed over trench isolation failed before the otherwise same devices except having active area (silicon) directly under the polysilicon emitter degeneration resistors. Forming the polysilicon (or likely other) emitter degeneration resistors directly on the active area 255 as shown in FIG. 2B made the transistors more robust likely due to the active area acting as a "heat sink" to reduce the heating resulting from conducting the ESD pulse.

The addition of an emitter resistor in series with the emitter is recognized to provides negative feedback to the transistor to reduce the filamentation risk. Disclosed gaps to provided resistors $R_1$ are oriented at least substantially parallel to a current flow in the segmented transistor(s). As used herein, substantially parallel means that the gap is able to prevent lateral current conduction in the metal and/or silicide material would otherwise be is between adjacent metal/silicide stack segments.

Figure 3:
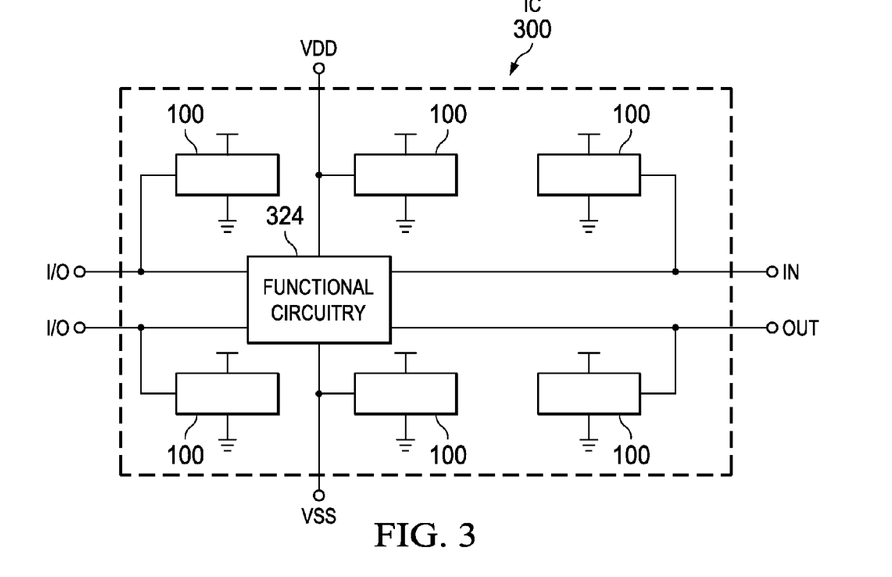
FIG. 3 illustrates a high level depiction of an ESD protected integrated circuit (IC) into which disclosed segmented bipolar transistors are incorporated to protect one or more terminals of the IC, according to an example embodiment.

FIG. 3 illustrates a high level depiction of a construction of an IC 300 into which disclosed segmented bipolar transistors shown as 100 functioning as ESD protection devices are incorporated to protect one or more terminals of the IC, according to an example embodiment. The "T" indicated at the top of the respective segmented bipolar transistors 100 in FIG. 3 represents an input provided by a suitable trigger circuit.

IC 300 includes functional circuitry 324, which is integrated circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals shown operate as common input and output terminals (I/O), by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to the ESD protection devices 100 is coupled to VSS, such as resistively coupled or shorted together.

IC 300 includes an instance of a disclosed segmented bipolar transistor 100 connected to each of its terminals. Each segmented bipolar transistor 100 is connected to its corresponding terminal in parallel with the functional circuitry 324. Segmented bipolar transistors 100 are also connected to power supply and reference voltage terminals VDD, VSS, in parallel with functional circuitry 324. However, in some applications, some pins of the device being protected will be self-protecting, such as diode protected power supply pins. Pins also can be protected against different levels of ESD strike (Human Body Model (HBM), Charged Device Model (CDM), IEC, etc.).

Figure 4A:
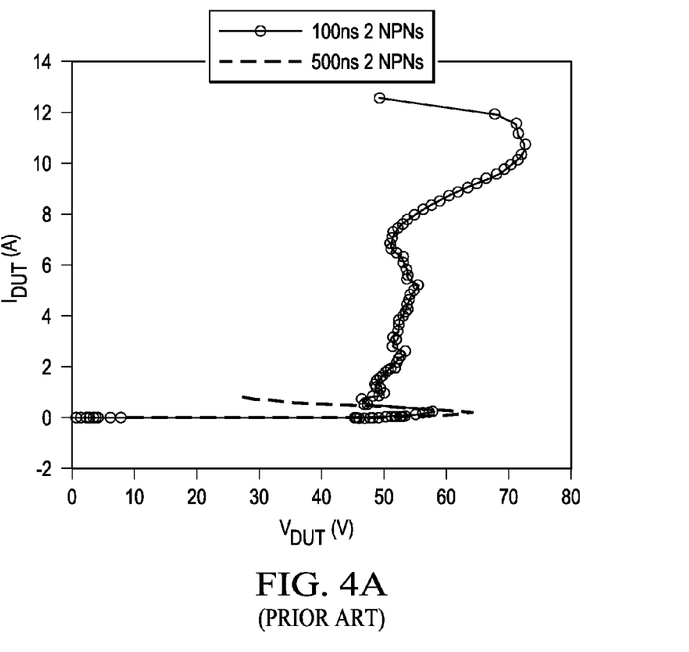
FIG. 4A depicts the ESD performance for 2 series connected known vertical NPN bipolar transistor transistors at 100 ns and at 500 ns TLP pulse widths used as a reference/control.

Disclosed embodiments are further illustrated by the following specific Examples, which should not be construed as limiting the scope or content of this Disclosure in any way. FIG. 4A depicts the ESD performance for a 2 series connected known vertical NPN bipolar transistors at 100 ns and 500 ns TLP pulse widths (used as a baseline reference/control). The known NPN bipolar transistors depicted in FIG. 4A show fairly good current handling performance for short (100 ns) TLP pulses, but at longer pulse lengths such as the 500 ns shown there is a failure below 1 Amp, where the current flow induced likely filaments resulting in the device experiencing a thermal failure. Even for 100 ns TLP pulses where a relatively larger amount of current may be conducted without failure, the known vertical NPN bipolar transistors' voltage goes up and down as a function of current and as a result this device is not a reliable voltage clamp nor is it scalable to longer pulses that are needed for system-level ESD tests.

Figure 4B:
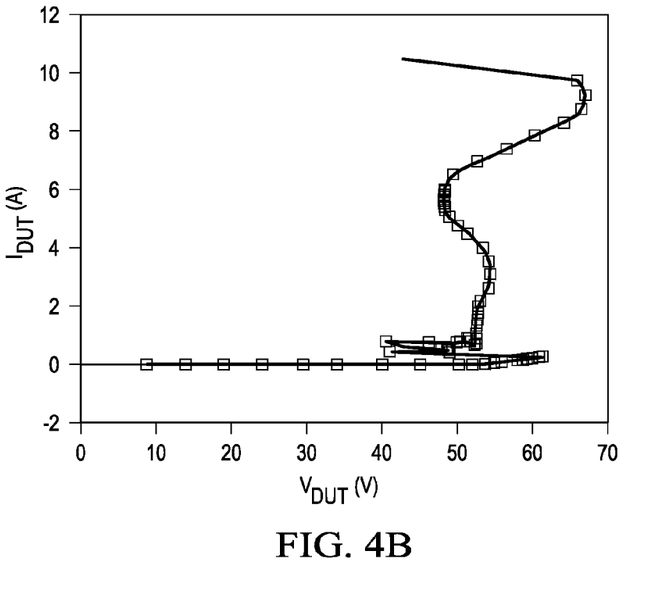
FIG. 4B depicts the ESD performance for 2 series connected disclosed segmented NPN bipolar transistor transistors at 100 ns TLP pulse widths, according to an example embodiment.
Figure 4C:
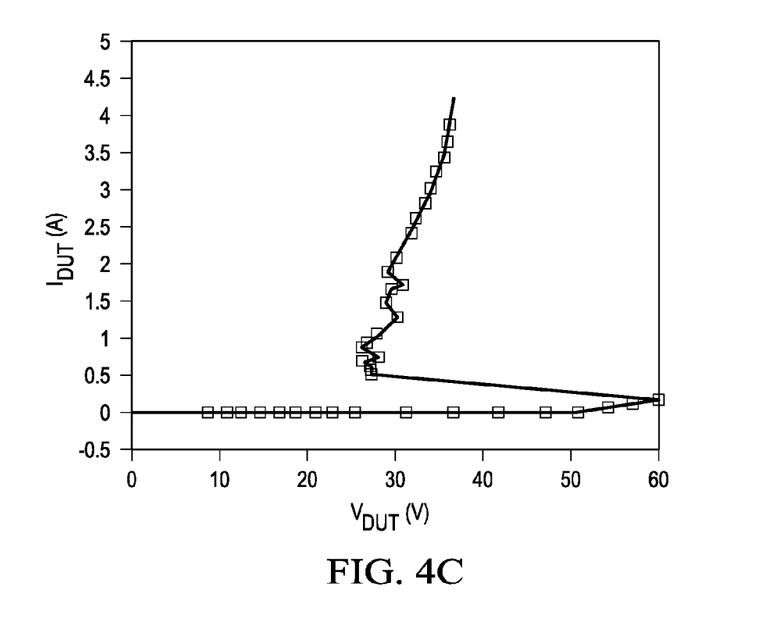
FIG. 4C depicts the ESD performance for 2 series connected disclosed segmented NPN bipolar transistor transistors at 500 ns TLP pulse widths, according to an example embodiment.

FIG. 4B and FIG. 4C depict the ESD performance for 2 series connected disclosed segmented NPN bipolar transistor transistors at 100 ns and 500 ns TLP pulse widths, respectively, according to an example embodiment. The disclosed segmented NPN bipolar transistors included segmentation in the emitter and n+ polysilicon emitter degeneration resistors with a resistance of about 0.44 ohms. Disclosed segmented NPN bipolar transistors can be seen in FIG. 4C to improve the 500 ns TLP robustness over the known reference (which as noted above failed below 1 Amp) by about order of magnitude. While the clamp behavior remains somewhat non-ideal (some voltage variation), disclosed segmented NPN bipolar transistors will be good candidates for higher performance system level ESD tests.

Advantages of disclosed embodiment include implementation without the use of new photomasked process steps. In one application an existing BiCMOS device can be modified by mask changes alone to support far more severe ESD pulse tests. It is expected that for automotive and other high voltage applications with system-level ESD testing requirements, disclosed segmented bipolar transistors will enable lower-cost higher-performance solutions.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A segmented bipolar transistor, comprising:
a substrate having a semiconductor surface;
a p-base in said semiconductor surface including at least one p-base finger comprising a base metal/silicide stack including a base metal line that contacts a silicide layer on said semiconductor surface of said p-base finger;
an n+ buried layer under said p-base in said semiconductor surface;
a collector including an n+ sinker diffusion lateral to said p-base extending from said semiconductor surface to said n+ buried layer including a collector finger comprising a collector metal/silicide stack including a collector metal line that contacts a silicide layer on said semiconductor surface of said collector finger, and
an n+ emitter within a portion of said p-base including at least one emitter finger comprising an emitter metal/silicide stack including an emitter metal line that contacts a silicide layer on said semiconductor surface of said emitter finger;
wherein said emitter metal/silicide stack includes segmentation comprising an emitter gap in said emitter metal line or in said silicide layer on said semiconductor surface of said emitter, or said collector metal/silicide stack includes segmentation comprising a collector gap in said collector metal line or in said silicide layer on said semiconductor surface of said collector finger.

2. The segmented bipolar transistor of claim 1, wherein said emitter gap is through both said emitter metal line and said silicide layer on said semiconductor surface of said emitter underlying said gap in said emitter metal line for forcing current flowing through said gap into said semiconductor surface of said emitter.

3. The segmented bipolar transistor of claim 2, further comprising said gap in said collector metal line and said silicide layer on said semiconductor surface of said collector under said gap in said collector metal line for forcing current flowing through said gap into said semiconductor surface of said collector.

4. The segmented bipolar transistor of claim 1, wherein said at least one base finger comprises a plurality of base fingers and said at least one emitter finger comprises a plurality of said emitter fingers interdigitated with said plurality of base fingers.

5. The segmented bipolar transistor of claim 1, further comprising an emitter degeneration resistor in series with said emitter.

6. The segmented bipolar transistor of claim 5, wherein said emitter degeneration resistor comprises doped polysilicon which is in direct contact with a region of active area on said semiconductor surface.

7. The segmented bipolar transistor of claim 1, wherein said segmented bipolar transistor comprises an array of said segmented bipolar transistors stacked in series, and said segmentation is positioned to add resistance to lateral current flow paths through said array.

8. The bipolar transistor of claim 1, wherein said semiconductor surface comprises silicon.

9. The bipolar transistor of claim 1, wherein said semiconductor surface comprises silicon/germanium and said substrate comprises silicon.

10. An integrated circuit (IC), comprising:
a substrate having a semiconductor surface;
functional circuitry formed using said semiconductor surface configured to realize and carry out a functionality having a plurality of terminals including at least a first terminal and a ground terminal;
at least one segmented bipolar transistor configured as an electrostatic discharge (ESD) protection device for said IC formed in said semiconductor surface, said segmented bipolar transistor including:
a p-base in said semiconductor surface including at least one p-base finger comprising a base metal/silicide stack including a base metal line that contacts a silicide layer on said semiconductor surface of said p-base finger;
an n+ buried layer under said p-base in said semiconductor surface;
a collector including an n+ sinker diffusion lateral to said p-base extending from said semiconductor surface to said n+ buried layer including a collector finger comprising a collector metal/silicide stack including a collector metal line that contacts a silicide layer on said semiconductor surface of said collector finger, and
an n+ emitter within a portion of said p-base including at least one emitter finger comprising an emitter metal/silicide stack including an emitter metal line that contacts a silicide layer on said semiconductor surface of said emitter finger;
wherein said emitter metal/silicide stack includes segmentation comprising an emitter gap in said emitter metal line or in said silicide layer on said semiconductor surface of said emitter, or said collector metal/silicide stack includes segmentation comprising a collector gap in said collector metal line or in said silicide layer on said semiconductor surface of said collector finger.

11. The IC of claim 10, wherein said emitter gap is through both said emitter metal line and said silicide layer on said semiconductor surface of said emitter underlying said gap in said emitter metal line for forcing current flowing through said gap into said semiconductor surface of said emitter.

12. The IC of claim 11, further comprising said gap in said collector metal line and said silicide layer on said semiconductor surface of said collector under said gap in said collector metal line for forcing current flowing through said gap into said semiconductor surface of said collector.

13. The IC of claim 11, wherein said at least one base finger comprise a plurality of base fingers and said at least one emitter finger comprises a plurality of said emitter fingers interdigitated with said plurality of base fingers.

14. The IC of claim 10, further comprising an emitter degeneration resistor in series with said emitter.

15. The IC of claim 14, wherein said emitter degeneration resistor comprises doped polysilicon which is in direct contact with a region of active area on said semiconductor surface.

16. The IC of claim 10, wherein said segmented bipolar transistor comprises an array of said segmented bipolar transistors stacked in series, and said segmentation is positioned to add resistance to lateral current flow paths through said array.

17. The IC of claim 10, wherein said semiconductor surface comprises silicon.

18. The IC of claim 10, wherein said semiconductor surface comprises silicon/germanium and said substrate comprises silicon.

\* \* \* \* \*